United States Patent [19]
Coleman

[11] 3,890,546
[45] June 17, 1975

[54] ELECTRICAL COMPONENT WITH OFFSET RADIAL LEADS

[75] Inventor: James H. Coleman, Wichita Falls, Tex.

[73] Assignee: Sprague Electric Company, North Adams, Mass.

[22] Filed: June 3, 1974

[21] Appl. No.: 475,465

[52] U.S. Cl. .............. 317/258; 317/101 C; 317/242; 317/261
[51] Int. Cl. ........................ H01c 1/035; H01c 1/14
[58] Field of Search ......... 317/261, 258, 101 C, 242

[56] References Cited

UNITED STATES PATENTS

| | | | |
|---|---|---|---|
| 3,184,661 | 5/1965 | Weller | 317/261 |
| 3,590,348 | 6/1971 | Bertics | 317/261 |
| 3,710,210 | 1/1973 | Heron | 317/261 |

*Primary Examiner*—E. A. Goldberg
*Attorney, Agent, or Firm*—Connolly and Hutz

[57] ABSTRACT

A radial leaded monolithic ceramic capacitor is described wherein the monolithic ceramic body has fired-silver terminal coatings adhered to each of two opposite body faces. The coatings extend over a portion of the adjacent body faces, to one of which a headed lead wire is soldered near each end. The lead heads each project outwardly beyond the silver coated body faces, and a solder fillet is formed therebetween providing a strong bond between the leads and the body.

9 Claims, 8 Drawing Figures

ELECTRICAL COMPONENT WITH OFFSET RADIAL LEADS

BACKGROUND OF THE INVENTION

This invention relates to rectangular electrical components having radial leads, and more particularly to components having two mutually parallel leads extending radially in the same direction from the component body, for direct assembly in printed wire boards or the like.

The attachment of radial leads to a component body having two metallized ends is typically accomplished by flattening or swagging the lead ends and soldering the flat lead portions to the metallized areas at or near the component ends. Such lead attachment means can be quite strong in tension, the weakest link commonly lying at the transition region in the lead between the round and the flattened parts. This weak transition region is especially prone to fracture when lateral flexing forces are applied to the lead. Also when such flattened leads are attached, for example by soldering, to opposite metallized ends of the component, the component package length is accordingly increased; and when the metallized portions extend part way over the adjacent body faces and flat leads are attached to a side face of the body, the component package width is accordingly increased. Since either increases in component package length or width requires a greater allocation of mounting board real-estate to it, such dimensional increases are normally undesirable. Also side attached leads become offset with respect to the axis or centerline of the body which is not compatible with standardized printed wire board layouts. Side attached leads are sometimes bent so as to exit the package in the central plane of the package but tension forces applied to such leads tends to rupture the encapsulating resin coating.

To overcome this problem, nail headed leads have been attached by soldering to the portions of the end metallization that extends partially to a common face of the component body, this face becoming the bottom face nearest the printed wire board to which the component package is mounted. The nail head is smaller than the body dimensions and does not increase the package dimensions as seen in top view. It is, however, difficult to attach leads in this manner having sufficient strength, particularly in tension.

Similar problems associated with various axial leaded constructions have been solved by using leads with oversized nail heads and forming a continuous solder fillet between the oversized head and the adjacent metallized body faces all around, as described by John Heron in U.S. Pat. No. 3,710,210 issued Jan. 9, 1973.

It is an object of the present invention to provide a radial leaded component package which leads resist fracture and detachment from the body due to tensil and other forces therebetween.

It is a further object of this invention to provide a radial leaded component package of minimum width, having a central alignment between the component body and the leads.

SUMMARY OF THE INVENTION

A rectangular electrical component body has metal coatings adhered to each of two opposite faces. The metal coatings extend to and cover a portion of at least one adjacent and common body face. Two lead wires, each having an enlarged head, are connected to the metal coatings, the enlarged head of each being adjacent to one of the metal coatings at said common body face. These connections are effected by solder bonds between each of the heads and the corresponding metal coating. The head is positioned so as to extend beyond the adjacent metal coated body end, forming a corner therewith wherein a solder fillet is formed. The head dimensions are less in width than that of the body and solder fillets are formed at the head rims and the metal coating on the adjacent common body face. Alternatively, the head dimensions are slightly larger than the width of the metallized body, and side fillets are formed similar in profile to the end fillet. In all cases the shaft of the lead intersects the plane in which the metallized body end lies, and the plane of the two radial leads substantially coincides with a bisecting body plane.

In comparison with soldered connections between headed leads and abutting metal surfaces where there is no head projection beyond the body, the component of the present invention exhibits surprising strength, especially in tension. The combination of the common inside solder fillets with one outside fillet produces a highly effective and simple lead connective structure for radially leaded components. Most such radial leaded components, especially very small ones, depend to an important degree upon the application of a protective covering encompassing the component body and the upper portion of the leads to provide adequate lead connective strength. In the present invention no such added strength is required and they may be supplied bare. Also, when a protective covering is desired for other reasons, the components of this invention are fully capable of withstanding the physical handling normally occurring in the coating processes. This reliable lead connective structure provides a component where the width is determined only by the width of the component body and the maximum length may be only a few thousanths of an inch longer than the length of the body; thus the mounting board real-estate required is minimized.

The geometry of the lead heads may take many forms, constrained only by the principles of this invention aforementioned. Also a plurality of metal end coated bodies may be stacked, aligned and soldered to form a component of this invention.

DESCRIPTION OF THE PREFERRED EMBODIMENTS

Figures 1, 2, 3, 4, 5, 6, 7, 8:
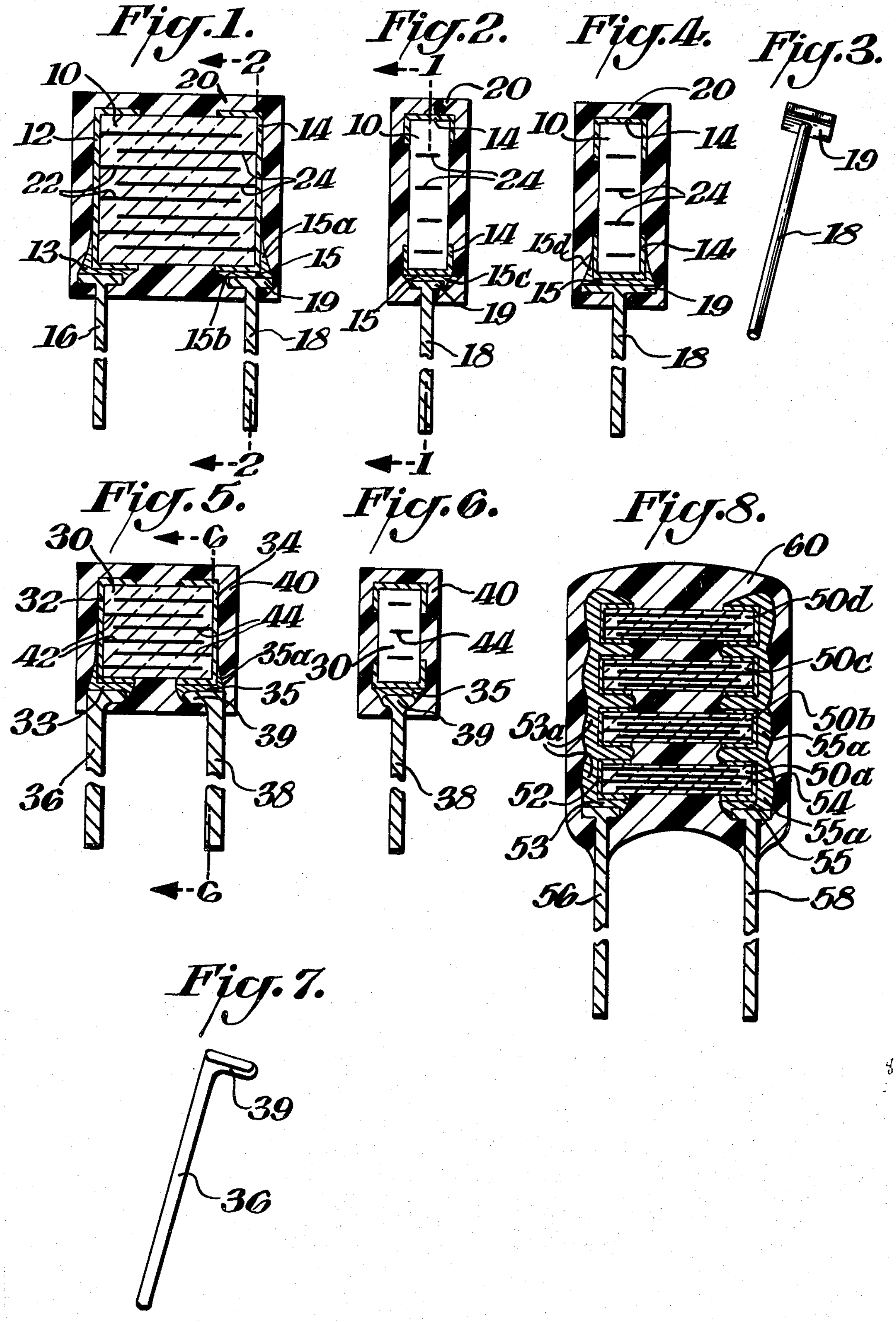
FIG. 1 shows a side sectional view of a first preferred embodiment of this invention taken in a central body plane 4—4 as defined in FIG. 2.
FIG. 2 shows an end sectional view of the component of FIG. 1 taken in plane 2—2.
FIG. 3 shows a perspective view of a headed lead of the component of FIG. 1.
FIG. 4 shows an end sectional view of a second preferred embodiment wherein the enlarged portion of the leads extends laterally beyond the wide dimensions of the metallized body. The side sectional view of this second preferred embodiment is as seen in FIG. 1.
FIG. 5 shows a side sectional view of a third preferred embodiment of this invention.
FIG. 6 shows an end sectional view of the component in FIG. 5 taken in the plane 6—6.
FIG. 7 shows a perspective view of the headed lead of the component of FIGS. 5 and 6.
FIG. 8 shows a side sectional view of a fourth preferred embodiment of this invention.

In a first preferred embodiment of this invention, a monolithic ceramic chip body 10, as shown in FIGS. 1 and 2, has two metal coatings 12 and 14 on opposite body faces, each said coating extending over a portion of the four commonly adjacent body faces. These coatings are conventionally made by dipping, brushing or otherwise applying an ink or paste comprising a glass frit, silver particles and an organic binder to the end regions of the capacitor chip body and firing the coated body to burn out the organic material and sinter the glass and silver forming a continuously conducting termination at each end.

A wire lead 18 of this embodiment has an enlarged head portion 19 as shown in FIG. 3. The head 19 is in the form of an elongated rectangular plate that may be made by a standard cold forming of the wire end or by attaching, as by welding, at right angles a plate 19 to a lead 18. The lead may be of any metal although copper is preferable. At least the head portion must be solderable and this is preferably accomplished by applying a solder or tin coating to the entire lead.

The sectional view as seen in FIG. 1 is taken in the central bisecting plane 1—1 of the body 10 as defined in FIG. 2. Internal to the ceramic body 10 are layers of conducting material, the alternate electrode layers 22 of which extend to one end face making contact to the termination coating 12, and the remaining interdigitated electrode layers 24 extend to the opposite body face making contact with the other termination coating 14. The methods of fabricating such monolithic capacitor bodies are well known in the art.

In the sectional views of FIGS. 1 and 2, a clear picture of the relative orientations and attachment means between leads 16 and 18 and body 10 is provided. The lead heads are offset and project beyond the metal end coverings 12 and 14 forming a corner therebetween. A solder bond 13 between covering 12 and lead 16, and a solder bond between covering 14 and lead 18, each include a solder fillet, e.g., 15*a*, being formed in these corners as seen in FIG. 1. These solder bonds also include solder fillets, e.g., 15*b*, between the opposite end of the plate heads and the metallized bottom body surface. Solder fillets, e.g., 15*c*, are also formed in the small corners between the side rims of the plate heads and the adjacent portions of the metal coverings as seen in FIG. 2. The solder bonds are formed by applying a solder paste to the parts to be bonded, and heating to reflow the solder. It is especially important that the lead wire shafts (e.g., 18) be positioned so as to intersect the plane (e.g., 2—2) of the body end. A downward force on the leads will thus be located directly below the end solder fillets and the joint will have maximum strength in lead tension.

A modification in the first preferred embodiment wherein the enlarged portions, e.g., 19, of the leads are made to extend laterally beyond the metallized body, represents a second preferred embodiment as shown in the end sectional view of FIG. 4. The side sectional view of the second preferred embodiment is as seen in FIG. 1, defining plane 2—2 in which the end sectional view of FIG. 4 is taken. Here the solder bonds, e.g., 15, include the end fillets, e.g., 15*a*, as well as side fillets 15*d*.

If the enlarged portions of the leads do not project at all beyond the lower metallized surface of the body, and no outside fillets, e.g., 15*a* and 15*d*, are premitted to form, only a flush solder solder bond can be made possibly with inside fillets, e.g., 15*b* and 15*c*. Such a bond provides a weak and unsatisfactory mechanical connection. The addition of an extension of the enlarged lead portion 19 at a body end and formation of a fillet 15*a* provides a dramatically stronger bond. This is particularly true when the lead body, e.g., 18 is positioned so as to intersect the plane, e.g., plane 2—2, in which the body end lies. A further lateral extension of the lead portion 19 and formation of side fillets, e.g., 15*d* add some strength but have the disadvantage in some situations that the width of the assembly must be increased.

In the sectional views of FIGS. 1 and 2 the component is shown having an insulative protective covering 20. Although such coverings are not essential for some component uses, they are generally desirable. An especially effective protective covering is made by transfer molding the component with a thermo-setting resin. An injection molded thermoplastic covering is also satisfactory. Alternatively, the leaded component may be supported by the leads, heated and submersed in a standard fluidized epoxy resin bed system, forming a conformal coating over the part. The coating 20 shown in the FIGS. 4 and 5 represent the disciplined geometry obtained in molding. The coating 60 shown in FIG. 8 is a conformal fluidized bed coating. Any coating should encompass the body, the solder bonds, and at least the enlarged end portions of the leads. The great strength of the connection made between the leads and the body by the end fileted solder bonds 13 and 15. needs no additional bonding aid from a protective covering such as 20 or 60; however greater strength is realized by applying such coverings.

In FIG. 5 is shown a side sectional view of a third preferred embodiment of this invention having a rectangular monolithic ceramic capacitor body 30 with a metal end coating 32 adhered to one body face and another metal end coating 34 adhered to the opposite body face. The coatings extend over a portion of at least one common adjacent body face, namely the bottom face as shown, where the leads 36 and 38 are bonded to coatings 32 and 34 by solder bonds 33 and 35, respectively. The body contains two sets of buried and interdigitated electrodes 42 and 44 that contact metal coatings 32 and 34, respectively. A protective molded resin covering 40 encompasses the leaded component assembly. FIG. 6 shows an end sectional view as indicated by plane 6—6 in FIG. 5. The lead 36 employed therein is shown in perspective view in FIG. 7, having an enlarged end portion consisting in a right angle projection 39 at the lead end which projection has a flat top. The diameter of the lead 36 and the width of the projection 39 are essentially equal. Two such leads 36 and 38 are shown in FIG. 5 having projections that face each other and each lead wire (e.g., 36) being offset outwardly relative to the body so as to reside under the body end faces and to extend slightly beyond the adjacent metal covered ends of the body 10 forming corners therebetween. The solder bonds include a fillet 35*a* being formed in these corners that greatly enhances the strength of the connection between body and leads.

In FIG. 8 is shown a fourth preferred embodiment of this invention similar to the first except that four rectangular monolithic ceramic capacitor bodies 50*a*, 50*b*, 50*c* and 50*d* all having essentially the same length and width are stacked in mutual alignment over each other. The solder bonds 53 and 55 connect the enlarged heads of leads 56 and 58 to the metal end coatings, respectively, of body 50*a* as well as connecting the adjacent end coverings of the stacked assembly. A molded protective covering 60 encompasses the leaded multi-body assembly. The lead heads are offset relative to the stacked body assembly and the solder bonds include a fillet in the corners formed thereby.

The solder bond connection between leads and body 50*a* and the connections between the adjacent of the four stacked bodies all possess an enhanced strength by having a continuous solder fillet or film on both ends of the assembly, 53*a* and 55*a*, respectively. Also in this fourth preferred embodiment, the profile of the component as seen in top view (not shown) need be no greater than for a single body component as described as the first preferred embodiment, the bodies all having the same length and width.

Thirteen prototype components were made in accordance with the first preferred embodiment described herein, having a monolithic ceramic body of dimensions three-eighths inch long, three-eighths inch high and three-sixteenths (0.1875) inch thick. The leads were of a solder tinned hard copper wire having a 0.020 inch diameter and having a head about 0.040 inch long. The lead head projected about 0.010 inch beyond the silver coated end coating at each end of the body. A 95% Sn/5% Ag solder paste, Sel-Bond SC-103 made by the Sel-Rex Company of Nutley, N.J. was applied to the lower left and lwoer right corners of the body (as seen in FIG. 1), the lead heads were pushed into the paste, being held there by a metal jig, and the assembly was passed through an infra red oven for a time just sufficient to reflow the solder. Silver containing solders composed of 95 Sn 5 Ag to 60 Sn 40 Ag are alternately suitable.

Eleven of the prototype units were then subjected to a lead pull test, with the result that the points of joint failure ranged from 9 to 11 pounds. In one case the connection between the silver coating and the body failed and in the remaining cases the ceramic itself failed in a region near the silver coating. The two remaining prototype units were given a protective fluidized bed epoxy covering, and upon subsequent pull testing all failed at 19 pounds with the wire breaking at a point about 0.1 inch from the body.

What is claimed is:

1. An electrical component having radial offset leads comprising:

a rectangular electrical component body;

a first and second metal coating covering one face and an opposite face of said body, respectively, each said coating extending over a portion of a common adjacent face of said component body;

a first and second lead wire extending away at right angles from said common adjacent face, said lead wires each having an enlarged end portion and a shaft portion, a part of said enlarged end portion of said first and second lead wires being offset and projecting outwardly beyond said one and said opposite faces, respectively; and solder bonds between said enlarged end portions of said first and second lead wires and said first and second coatings, respectively, a solder fillet filling the corner formed at said projecting enlarged end portion, said shaft of said lead wires lying in a plane that is essentially coincident with a bisecting plane of said body, a first body surface plane in which said one body face lies being intersected by said shaft of said first lead wire and a second body surface plane in which said opposite body face lies being intersected by said shaft of said second lead wire.

2. The component of claim 1 wherein said first and second metal coatings further have other extensions over a portion of the other commonly adjacent faces to said one and to said opposite body faces, and wherein said enlarged end portions of said lead wires are wider than and project beyond the wide dimensions of said metal coated body, each said solder bond further including other fillets between said laterally projecting enlarged end portions and two of said other metal coating extensions.

3. The component of claim 1 wherein said enlarged end portion of each of said leads includes one dominant lateral projection at the end of said lead forming a flattened enlarged surface at said lead end, said dominant lateral projections of said two leads facing each other.

4. The component of claim 1 wherein said body comprises a dielectric ceramic material having a plurality of buried layers, the alternate of said layers extending to said one body face and contacting said first metal coating, the other of said layers extending to said opposite face and contacting said second metal coating.

5. The component of claim 1 wherein said metal coatings are comprised of silver and said solder bonds are a solder alloy composed of from 60–99% tin and from 1–40% silver.

6. The component of claim 1 further comprising at least a second rectangular component body, said bodies having essentially the same length and width, said bodies being stacked in mutual alignment and each said solder bond extending continuously to contact the adjacent of said end coverings and making electrical and physical contact therebetween.

7. The component of claim 1 additionally comprising an insulative and protective outer covering over said component, over said soldered bonds and over said enlarged portions of said leads.

8. The component of claim 7 wherein said insulative covering is a molded resin.

9. The component of claim 7 wherein said insulative coating is a conformal fluidized bed covering material.

* * * * *